(12) United States Patent  (10) Patent No.: US 6,294,413 B1
Tseng  (45) Date of Patent: Sep. 25, 2001

(54) METHOD FOR FABRICATING A SOI (SILICON ON INSULATOR) DEVICE

(75) Inventor: Horng-Huei Tseng, Hsinchu (TW)

(73) Assignee: Vanguard International Semiconductor Corp., Hsinchu (TW)

( * ) Notice: Subject to any disclaimer, the term of this patent is extended or adjusted under 35 U.S.C. 154(b) by 0 days.

(21) Appl. No.: 09/751,917

(22) Filed: Dec. 27, 2000

(51) Int. Cl.⁷ ................................................. H01L 21/84
(52) U.S. Cl. ........................ 438/164; 438/154; 438/406
(58) Field of Search ................................... 438/164, 406, 438/455, 154, 149

(56) References Cited

U.S. PATENT DOCUMENTS

| | | | |
|---|---|---|---|
| 4,970,175 | * 11/1990 | Haisma et al. | 438/456 |
| 5,091,330 | * 2/1992 | Cambou et al. | 438/459 |
| 5,260,233 | * 11/1993 | Buti et al. | 438/455 |
| 5,521,399 | * 5/1996 | Chu et al. | 257/36 |
| 5,528,054 | * 6/1996 | Ipposhi et al. | 257/66 |
| 5,597,739 | * 1/1997 | Sumi et al. | 438/459 |
| 5,795,810 | * 8/1998 | Houston | 438/404 |
| 6,004,835 | * 12/1999 | Noble | 438/149 |
| 6,110,769 | 8/2000 | Son . | |
| 6,218,248 | * 4/2001 | Hwang et al. | 438/294 |

* cited by examiner

Primary Examiner—Kevin M. Picardat
(74) Attorney, Agent, or Firm—Jiawei Huang; J.C. Patents (57) ABSTRACT

A method for fabricating an SOI semiconductor device with reduced floating body effects and a simplified method of fabrication. In the invention, a N-type doped dielectric layer or P-type doped dielectric layer is used to be driven into the semiconductor layer to form source/drain regions of field effect transistors of CMOS and conductive regions. For fabricating a NMOS transistor and a PMOS transistor of the CMOS device, the invention provides a method which an ion implantation process and a photo mask are omitted, by which the method will decrease the complexity of the fabrication process and the cost thereof.

32 Claims, 12 Drawing Sheets

METHOD FOR FABRICATING A SOI (SILICON ON INSULATOR) DEVICE

BACKGROUND OF THE INVENTION

1. Field of the Invention

This invention relates to a method for fabricating semiconductor device, and more particularly, to a method for fabricating an SOI semiconductor device.

2. Description of Related Art

Figure 1A:
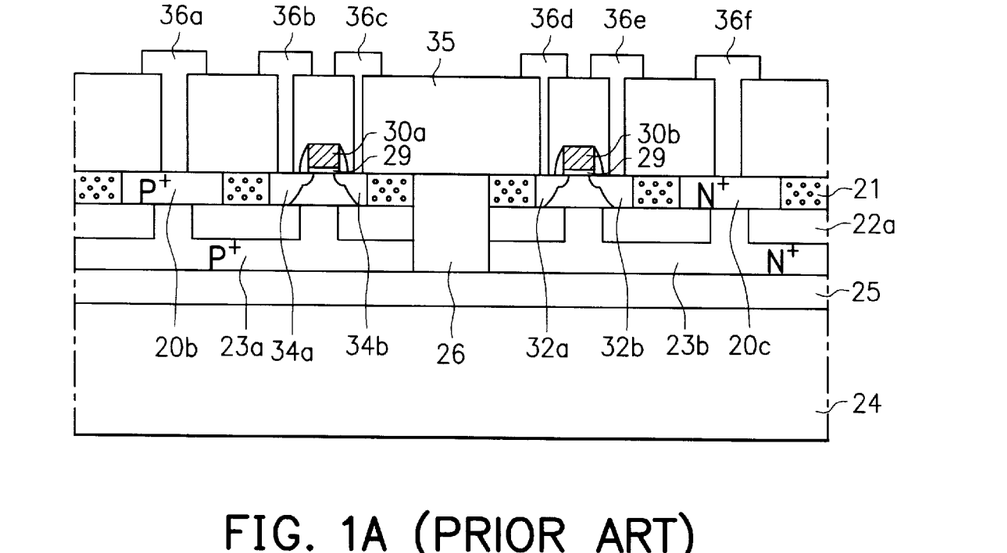

A related art SOI device is disclosed in U.S. Pat. No. 6,110,769 issued to Jeong Hwan Son, titled "SOI (SILICON ON INSULATOR) DEVICE AND METHOD FOR FABRICATING THE SAME", which is shown in FIGS. 1A and 1B–1H. Refer to FIG. 1A, which is a cross-sectional view showing a structure of a conventional SOI device.

A buried oxide film 25 is formed on a semiconductor substrate 24. P and N-type heavily doped polysilicon layers 23a and 23b are formed on the buried oxide film 25 and isolated from each other by an isolation oxide film 26 formed on the buried oxide film 25. Buried oxide films 22a are formed in the p and N-type heavily doped polysilicon layers 23a and 23b to be spaced apart.

A P-type semiconductor layer 20b and a first active region are formed on the first buried oxide film 22a, spaced apart from the P-type heavily doped polysilicon layer 23a. A first oxide film 21 is formed between the P-type semiconductor layer 20b and the first active region.

An N-type semiconductor layer 20c and a second active region are formed on the first buried oxide film 22a, spaced apart from the N-type heavily doped. A first oxide film 21 is formed between the N-type semiconductor layer 20c and the second active region.

A gate oxide film 29 and a first gate electrode 30a are successively formed on the first active region on the P-type heavily doped polysilicon layer 23a. Source/drain regions 34a/34b are formed in the first active region at both sides of the first gate electrode 30a.

A gate oxide film 29 and a second gate electrode 30b are successively formed on the second active region on the N-type heavily doped polysilicon layer 23b. Source/drain region 32a/32b are formed in the second active region at both sides of the second gate electrode 30b.

Formed is an interlayer insulating film 35 having contact holes on the p and N-type semiconductor layers 20b and 20c and the source/drain regions 32a/32b and 34a/34b. Contact pads 36a and 36f and line layers 36b, 36c, 36d, and 36e are formed in the contact holes and on the interlayer insulating layer adjoining to the contact holes.

The first and second active regions are connected to the p and N-type semiconductor layers 20b and 20c through the p and N-type polysilicon layers 23a and 23b, respectively.

Figure 1B:
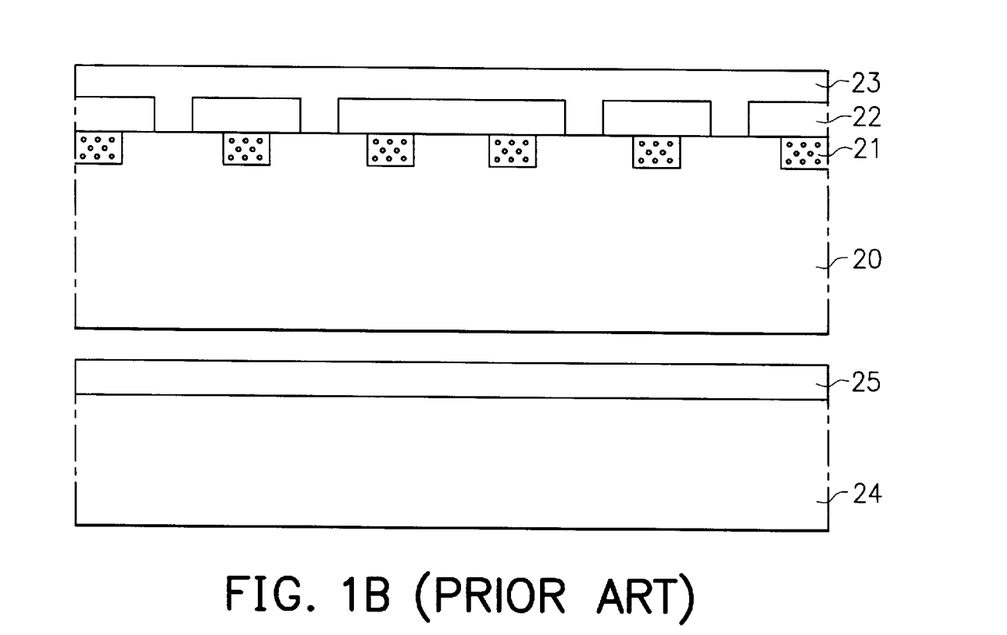
FIGS. 1B–1H are cross-sectional views showing conventional process steps of a method for fabricating the SOI device as shown in FIG. 1A.

Refer to FIGS. 1B–1H, are cross-sectional views showing conventional process steps of a method for fabricating the SOI device as shown in FIG. 1A First refer to FIG. 1B, a first semiconductor substrate 20 is provided. The first substrate 20 is etched to form a plurality of trenches. An oxide film is deposited on the substrate 20 and the trenches. Subsequently, a CMP process is performed to form a first oxide film 21 filling the trenches.

Next, a first buried oxide film 22 is formed on the first semiconductor substrate 20 by CVD.

A photoresist film is formed on the first buried oxide film 22 and patterned to expose areas of the first buried oxide film 22. Using the patterned photoresist as a mask, the first buried oxide film 22 is removed to expose the first substrate 20. Next an undoped polysilicon layer is deposited on the first buried oxide film 22 and the first substrate 20. The undoped polysilicon layer is then etched-back forming a thick undoped polysilicon layer 23.

A second semiconductor substrate 24 is provided and a second buried oxide film 25 is deposited on the second substrate 24. Subsequently, the second buried oxide film 25 on the second substrate 24 and the undoped polysilicon layer 23 on the first substrate 20 are bonded together by undergoing a high temperature process Refer to FIG. 1C. The first substrate 20 is polished until the first oxide film 21 using the first oxide film 21 as an etch stop. In order to form a trench isolation region, the semiconductor layer 20a between the first oxide film 21, the first buried oxide film 22, and the undoped polysilicon layer 23 are etched. An oxide film is deposited on the first oxide film 21, the semiconductor layer 20a, and the trench isolation region and then planarizing the oxide film to form an isolation oxide film 26.

Figure 1C:
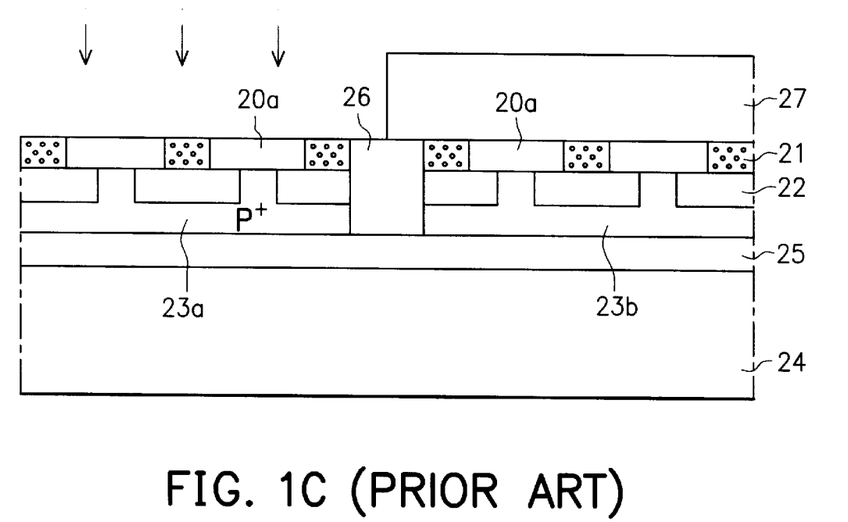

Next, a photoresist film 27 covers the first oxide film 21, the semiconductor layer 20a and the isolation oxide film 26. The photoresist film 27 is patterned and removed to expose part of the isolation oxide film 26. Using the patterned photoresist film 27 as a mask, the undoped polysilicon layer 23 is injected with boron ions to create a P-type heavily doped polysilicon layer 23a.

Figure 1D:
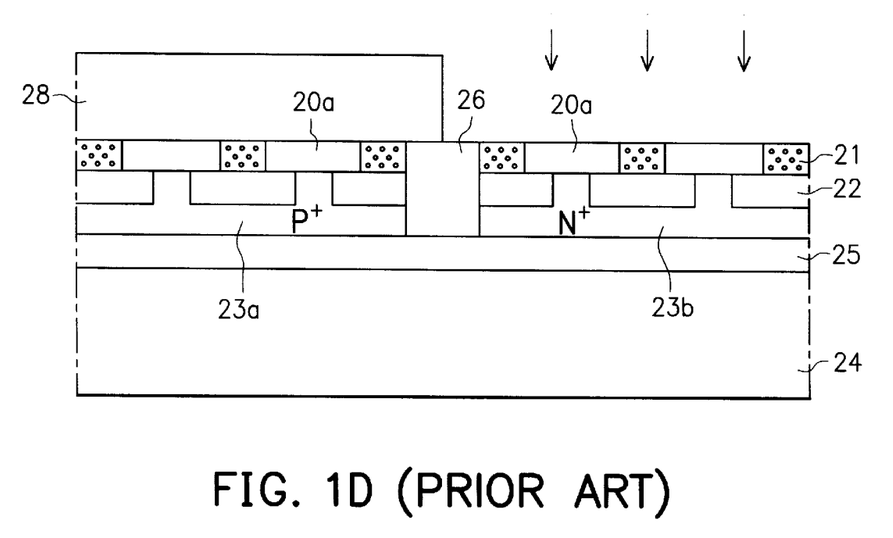

Refer to FIG. 1D. Subsequently, another photoresist film 28 covers the first oxide film 21, the semiconductor layer 20a and the isolation oxide film 26 and patterned. The photoresist film 28 is then removed to expose part of the isolation oxide film that was covered by the photoresist film 27 in the previous step. Using the patterned photoresist film 28 as a mask, the undoped polysilicon layer 23a is injected with phosphorus ions to become an N-type heavily doped polysilicon layer 23b.

Figure 1E:
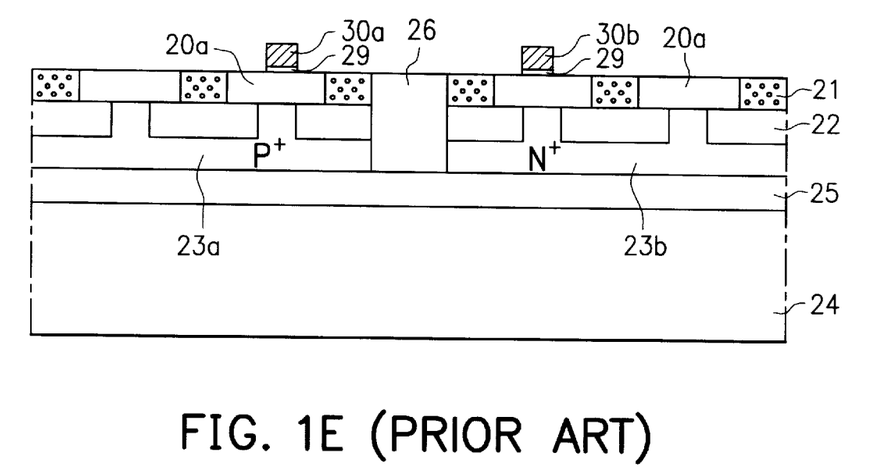

Refer to FIG. 1E. An oxide film and a silicon layer are deposited and etched. The result is a gate oxide film 29 and a first gate electrode 30a for an NMOS transistor and a gate oxide film 29 and a second gate electrode 30b for a PMOS transistor formed on the semiconductor layer 20a.

Figure 1F:
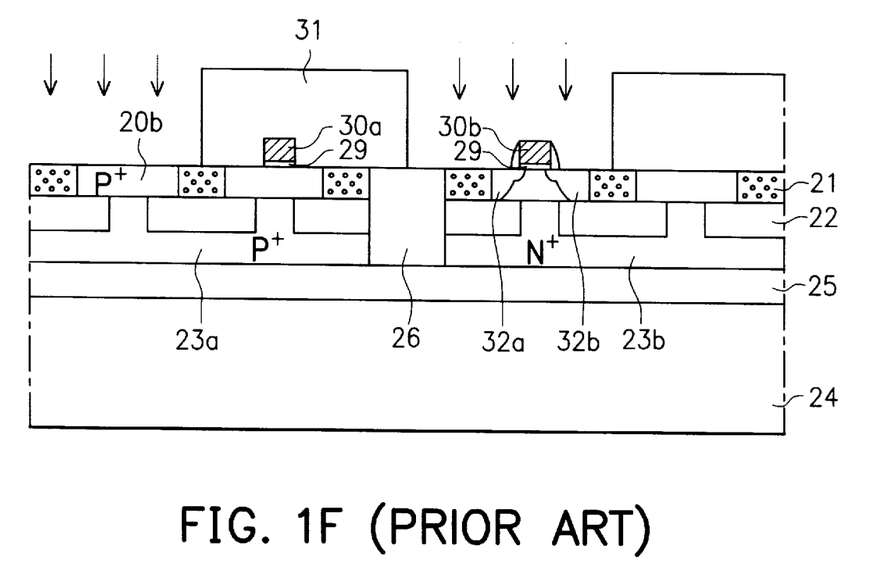

Refer to FIG. 1F. A photoresist film 31 is formed and patterned to expose the semiconductor layer 20a on both sides of the second gate electrode 30b and where the first gate electrode 30a is not formed. Using the patterned photoresist film 31 as a mask, the P-type semiconductor layer 20b is injected with P-type boron ions to form lightly doped source/drain regions 32a and 32b.

Figure 1G:
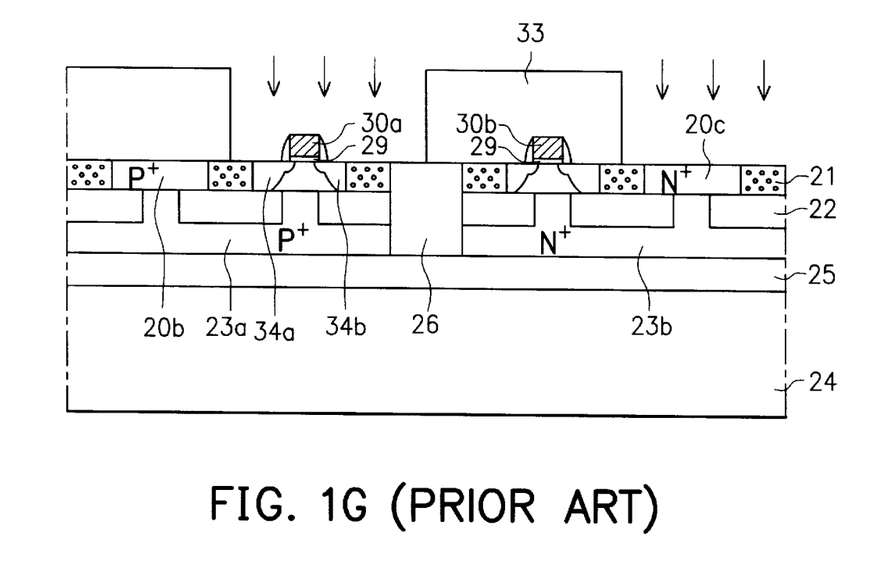

Refer to FIG. 1G. A photoresist film 33 is formed and patterned to expose the semiconductor layer 20a on both sides of the first gate electrode 30a and where the second gate electrode 30b is not formed. Using the patterned photoresist film 33 as a mask, the N-type semiconductor layer 20c is injected with N-type As ions to form lightly doped source/drain regions 34a and 34b.

Figure 1H:
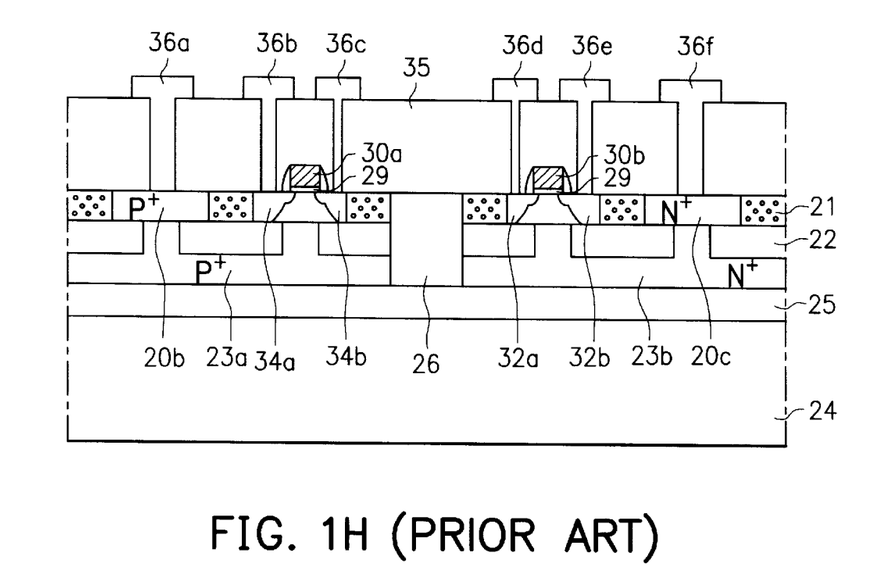

Refer to FIG. 1H. Depositing and removing an insulating film 35 to expose areas of the P-type semiconductor layer 20b, the N-type semiconductor layer 20c, the P-type source/drain regions 32a and 32b and the N-type source/drain regions 34a and 34b and form contact holes. A conductive layer is formed to fill the contact holes. The conductive layer is etched to form contact pads 36a and 36f on the P-type and N-type semiconductor layers 20b and 20c and line layers 36b, 36c, 36d, 36e on the n and p source/drain regions 32a/32b and 34a/34b.

The conventional method for fabricating an SOI semiconductor device as described above comprises implanting P-type ions to form regions 20*b*, 32*a*, and 32*b*. Additionally, the conventional method requires implanting N-type ions to form regions 20*c*, 34*a*, and 34*b*. Since photoresist films are used as ion-implantation masks, two lithography mask steps and two ion implantation steps need to be performed, which increases the complexity of the fabrication process and the cost thereof.

SUMMARY OF THE INVENTION

In accordance with the foregoing and other objectives of the present invention, the invention provides a method for fabricating a SOI semiconductor device, which overcomes the drawbacks of the conventional SOI device.

A first semiconductor substrate is etched to form a plurality of trenches. An oxide film is deposited on the substrate and the trenches. A first oxide film is deposited which fills the trenches. A first buried oxide film is formed on the first semiconductor substrate. A photoresist film is formed on the first buried oxide film and patterned to expose areas of the first buried oxide film. Using the patterned photoresist as a mask, the first buried oxide film is removed to expose the first substrate. Next an undoped polysilicon layer is deposited on the first buried oxide film and the first substrate. The undoped polysilicon layer is then etched-back.

A second buried oxide film is deposited on a second substrate. The second buried oxide film on the second substrate and the undoped polysilicon layer on the first substrate are bonded together by undergoing a high temperature process.

The first substrate is polished until the first oxide film is exposed using the first oxide film as an etch stop. In order to form a trench isolation region, the semiconductor layer between the first oxide film, the first buried oxide film, and the undoped polysilicon layer are etched. An oxide film is deposited on the first oxide film, the semiconductor layer, and the trench isolation region and then planarizing the oxide film to form an isolation oxide film.

Next, a photoresist film covers the first oxide film, the semiconductor layer and the isolation oxide film. The photoresist film is patterned and removed to expose part of the isolation oxide film. Using the patterned photoresist film as a mask, the undoped polysilicon layer is injected with, for example, boron ions to create a P-type heavily doped polysilicon layer.

Subsequently, another photoresist film covers the first oxide film, the semiconductor layer and the isolation oxide film and patterned. The photoresist film is then removed to expose part of the isolation oxide film that was covered by the photoresist film in the previous step. Using the patterned photoresist film as a mask, the undoped polysilicon layer is injected with, for example, phosphorus ions to become an N-type heavily doped polysilicon layer.

An oxide film and a silicon layer are deposited and etched. The result is a gate oxide film and a first gate electrode for an NMOS transistor and a gate oxide film and a second gate electrode for a PMOS transistor, formed on the semiconductor layer. A doped dielectric layer, for example, n-doped PSG, is formed over the surface by, for example, CVD.

A photoresist film is formed and patterned over the dielectric layer. An area of the doped dielectric layer is removed to expose the semiconductor layer on both sides of the second gate electrode and where the first gate electrode is not formed. Using the patterned photoresist film as a mask, the P-type semiconductor layer is injected with P-type boron ions to form lightly doped source/drain regions. The photoresist film is then removed.

Next, the n-dopant inside the doped dielectric layer is driven into the N-type semiconductor layer to form lightly doped source/drain regions.

Depositing and removing an insulating film to expose areas of the P-type semiconductor layer, the N-type semiconductor layer, the P-type source/drain regions and the N-type source/drain regions and form contact holes. A conductive layer is formed to fill the contact holes. The conductive layer is etched to form contact pads on the P-type and N-type semiconductor layers and line layers on the n and p source/drain regions.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIG. 1A, which is a cross-sectional view showing a structure of a conventional SOI device.

DETAILED DESCRIPTION OF PREFERRED EMBODIMENTS

Refer to FIGS. 2A–2L, which are cross-sectional views showing process steps of a method for fabricating the SOI device according to a preferred embodiment of the present invention.

Figure 2A:
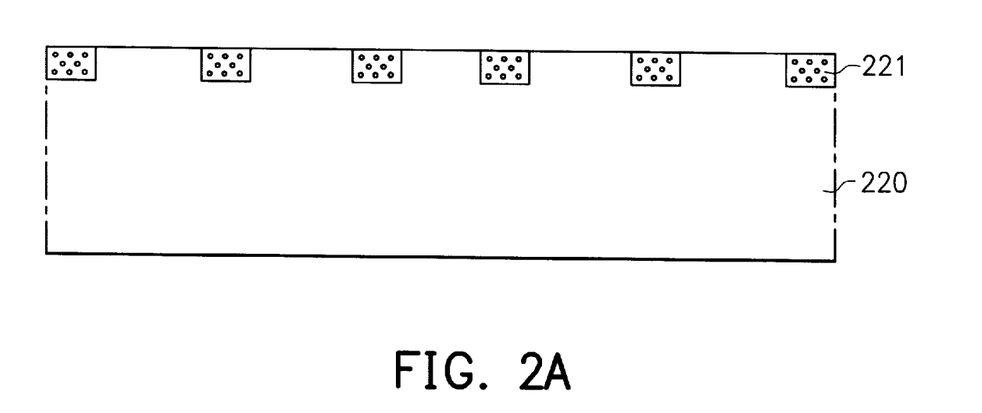
FIGS. 2A–2L are cross-sectional views showing process steps of a method for fabricating the SOI device according to a preferred embodiment of the present invention.

A first semiconductor substrate 220 is etched to form trenches. A first oxide film 221 is deposited which fills the trenches.

Figure 2B:
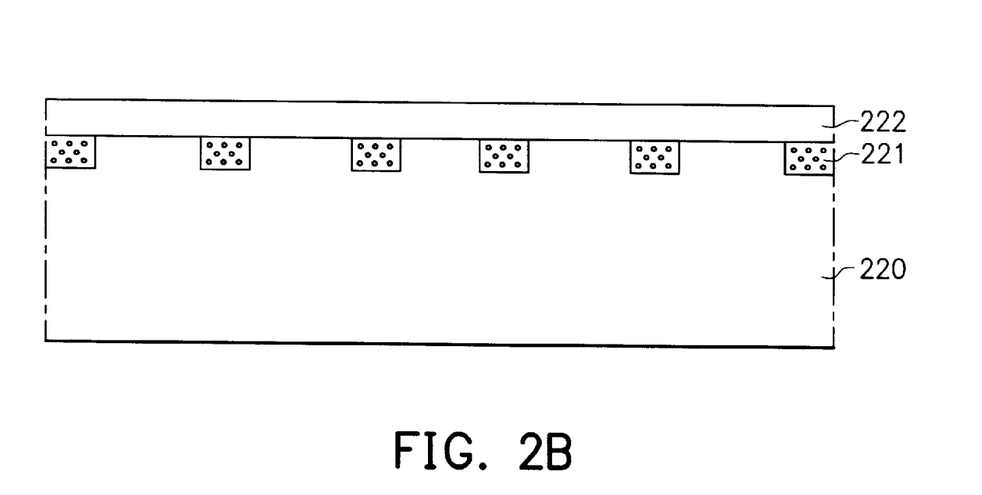

Refer to FIG. 2B, a first buried oxide film 222 is formed on the first semiconductor substrate 220.

Figure 2C:
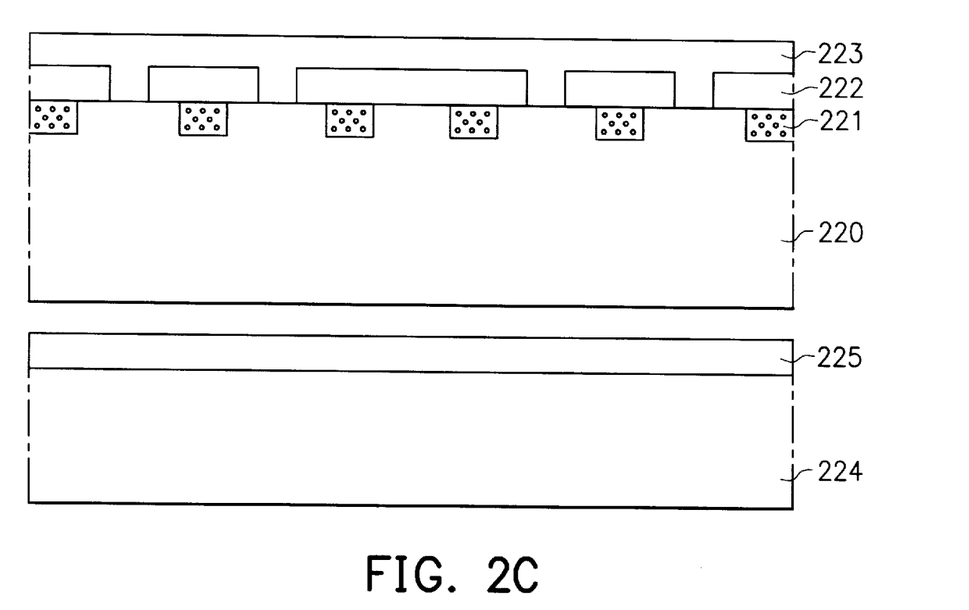

Refer to FIG. 2C, a photoresist film is formed on the first buried oxide film 222 and patterned to expose areas of the first buried oxide film 222. Using the patterned photoresist as a mask, the first buried oxide film 222 is removed to expose the first substrate 220. Next an undoped polysilicon layer is deposited on the first buried oxide film 222 and the first substrate 220. The undoped polysilicon layer is then etched-back to form an undoped polysilicon layer 223.

A second buried oxide film 225 is deposited on a second substrate 224.

Figure 2D:
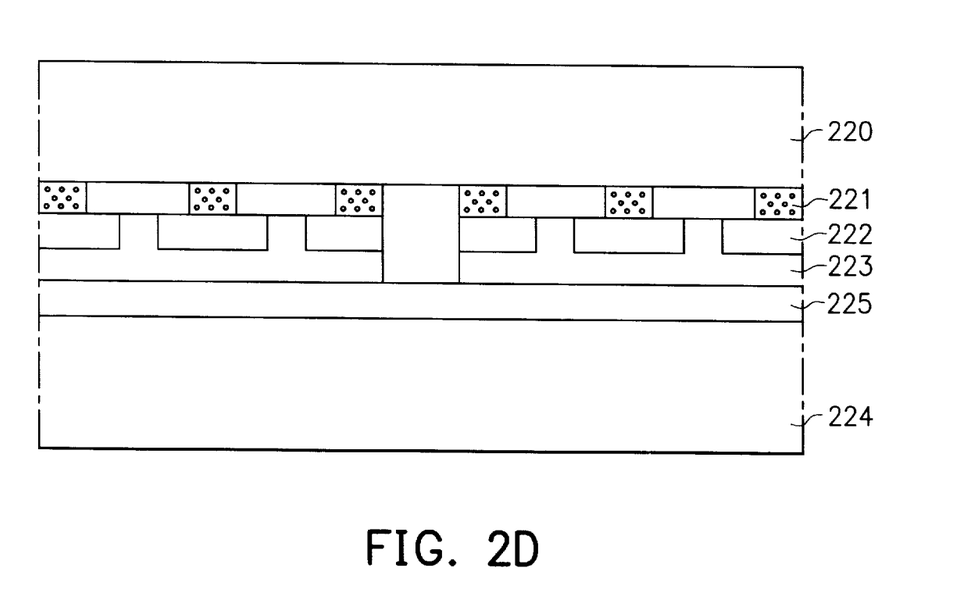

Refer to FIG. 2D, the second buried oxide film 225 on the second substrate 224 and the undoped polysilicon layer 223 on the first substrate 220 are bonded together by undergoing a high temperature process.

Figure 2E:
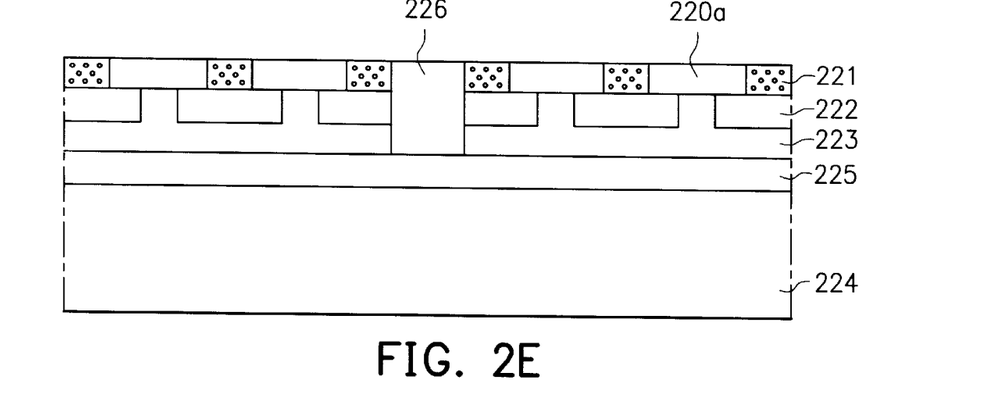

Refer to FIG. 2E, the first substrate 220 is polished until the first oxide film 221 is exposed using the first oxide film 221 as an etch stop. In order to form a trench isolation region, the semiconductor layer 220*a* between the first oxide film 221, the first buried oxide film 222, and the undoped polysilicon layer 223 are etched. An oxide film is deposited on the first oxide film 221, the semiconductor layer 220a, and the trench isolation region and then planarizing the oxide film to form an isolation oxide film 226.

Figure 2F:
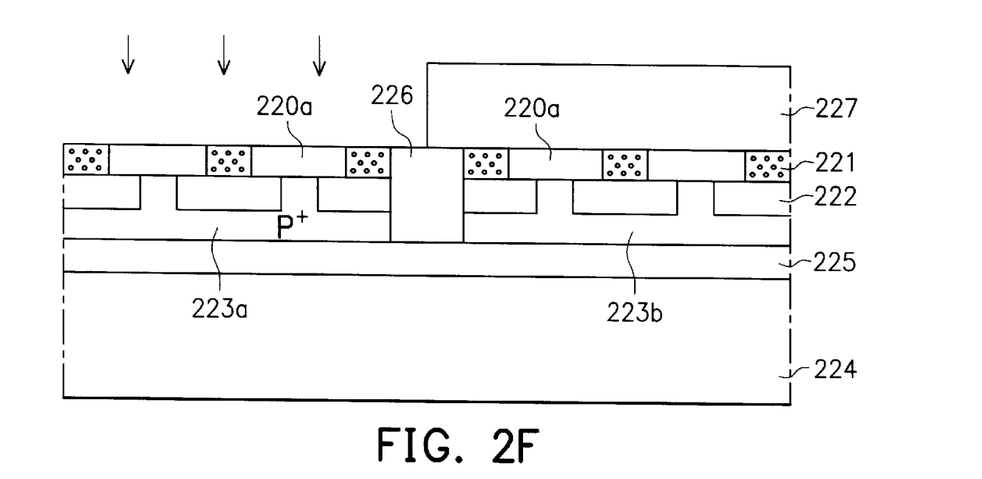

Refer to FIG. 2F, a photoresist film 227 covers the first oxide film 221, the semiconductor layer 220a and the isolation oxide film 226. The photoresist film 227 is patterned and removed to expose part of the isolation oxide film 226. Using the patterned photoresist film 227 as a mask, the undoped polysilicon layer 223 is injected with boron ions to create a P-type heavily doped polysilicon layer 223a.

Figure 2G:
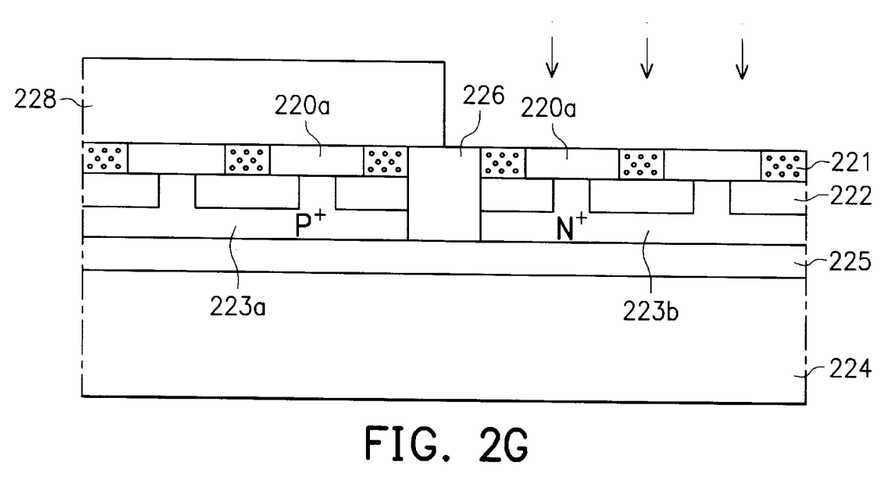

Refer to FIG. 2G, another photoresist film 228 covers the first oxide film 221, the semiconductor layer 220a and the isolation oxide film 226 and patterned. The photoresist film 228 is then removed to expose part of the isolation oxide film that was covered by the photoresist film 227 in the previous step. Using the patterned photoresist film 228 as a mask, the undoped polysilicon layer 223a is injected with phosphorus ions to become an N-type heavily doped polysilicon layer 223b.

Figure 2H:
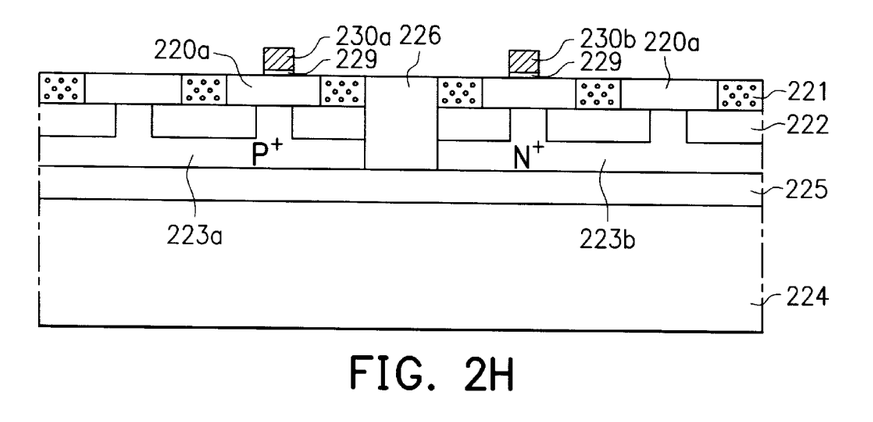

Refer to FIG. 2H, an oxide film and a silicon layer are deposited and etched. The result is a gate oxide film 229 and a first gate electrode 230a for an NMOS transistor and a gate oxide film 229 and a second gate electrode 230b for a PMOS transistor, formed on the semiconductor layer 220a.

Figure 2I:
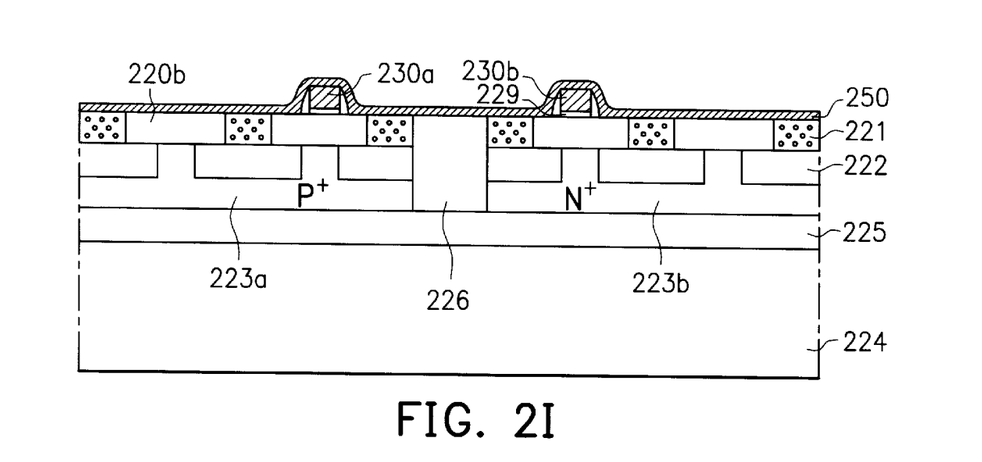

Refer to FIG. 2I, A doped dielectric layer 250, for example, n-doped PSG (Phosphosilicate Glass) or n-doped SOG (Spin-On-Glass), is sequentially formed over the surface of the substrate 224 by, for example, chemical vapor deposition (CVD).

Figure 2J:
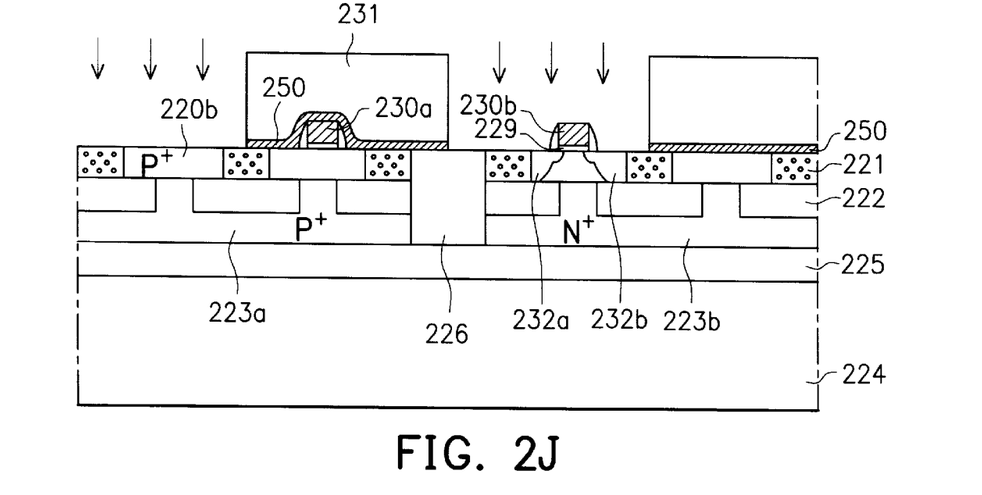

Refer to FIG. 2J, a photoresist film 231 is formed and patterned over the doped dielectric layer 250. An area of the doped dielectric layer 250 is removed to expose the semiconductor layer 220a on both sides of the second gate electrode 230b and the semiconductor layer 220b beside the first gate electrode 230a, where the first gate electrode 230a and the semiconductor layer 220a beside the second gate electrode 230b are not exposed. Using the patterned photoresist film 231 as a mask, the P-type semiconductor layer 220b is injected with P-type boron ions to form lightly doped source/drain regions 232a and 232b. The photoresist film 231 is then removed.

Figure 2K:
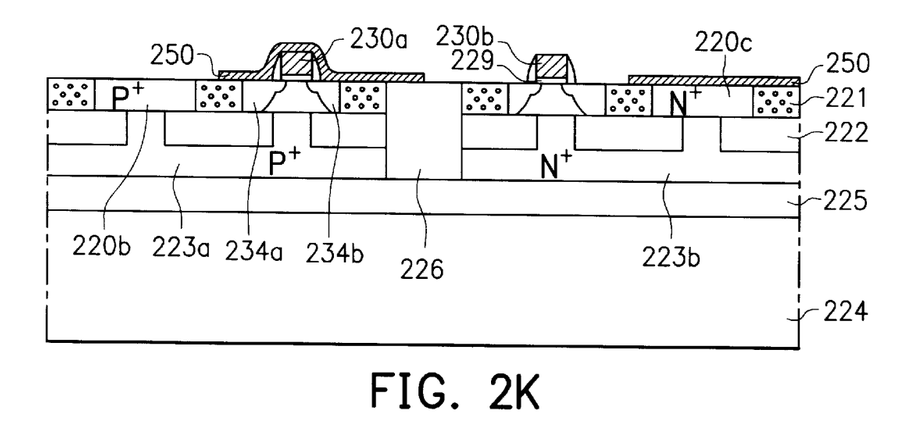

Refer to FIG. 2K, the N-type dopants inside the doped dielectric layer 250 are driven into the doped N-type semiconductor layer at a high temperature in an environment of inert gas to form n⁺doped source/drain regions 234a and 234b, as well as the n⁺doped semiconductor layer 220c as shown in FIG. 2K.

Figure 2L:
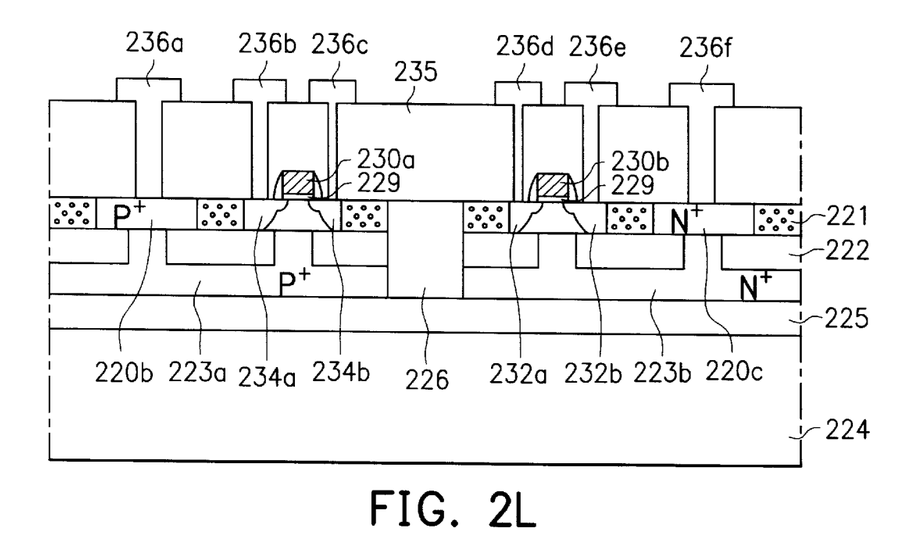

Refer to FIG. 2L, depositing and removing an insulating film 235 to expose areas of the P-type semiconductor layer 220b, the N-type semiconductor layer 220c, the P-type source/drain regions 232a and 232b and the N-type source/drain regions 234a and 234b and form contact holes. A conductive layer is formed to fill the contact holes. The conductive layer is etched to form contact pads 236a and 236f on the P-type and N-type semiconductor layers 220b and 220c and line layers 236b, 236c, 236d, 236e on the n and p source/drain regions 232a/232b and 234a/234b.

Figure 3I:
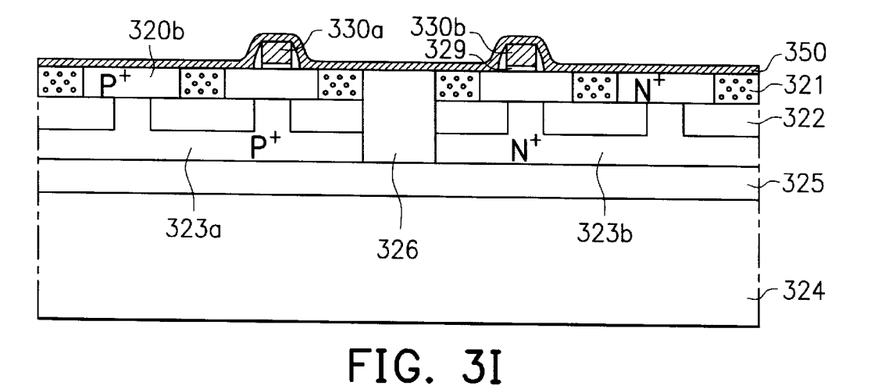
FIGS. 3I–3L are cross-sectional views showing an SOI device according to an embodiment of the present invention.

Refer to FIGS. 3I–3L, which are cross-sectional views showing process steps of a method for fabricating the SOI device according to another preferred embodiment of the present invention. The embodiment of the present invention comprises similar steps of forming the SOI device as shown in FIGS.2A–2L through forming the gate oxide film 329 and the first gate electrode 330a for an NMOS transistor and a gate oxide film 329 and a second gate electrode 330b for a PMOS transistor, formed on the semiconductor layer 320a, as shown in FIG. 3I.

Refer to FIG. 3I, a doped dielectric layer 350, for example, p-doped boronsilicate glass (BSG) or p-doped SOG is formed over the surface of the substrate 324 by, for example, CVD.

Figure 3J:
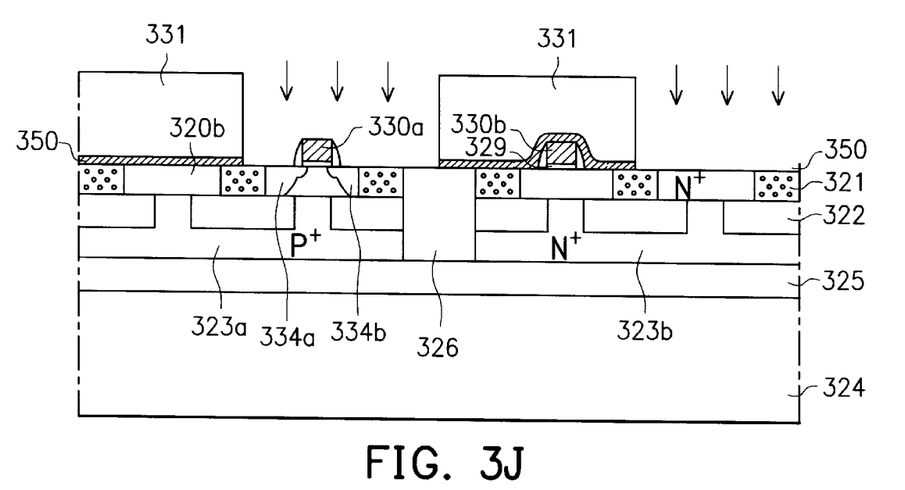

Refer to FIG. 3J, a photoresist film 331 is formed and patterned over the doped dielectric layer 350. An area of the doped dielectric layer 350 is removed to expose the semiconductor layer 320b on both sides of the second gate electrode 330a and the semiconductor layer 320b beside the second gate electrode 330b, where the first gate electrode 330b and the semiconductor layer 320b beside the first gate electrode 330a is not exposed. Using the patterned photoresist film 331 as a mask, the N-type semiconductor layer 320a is injected with N-type As ions to form doped source/drain regions 334a and 334b. The photoresist film 331 is then removed.

Figure 3K:
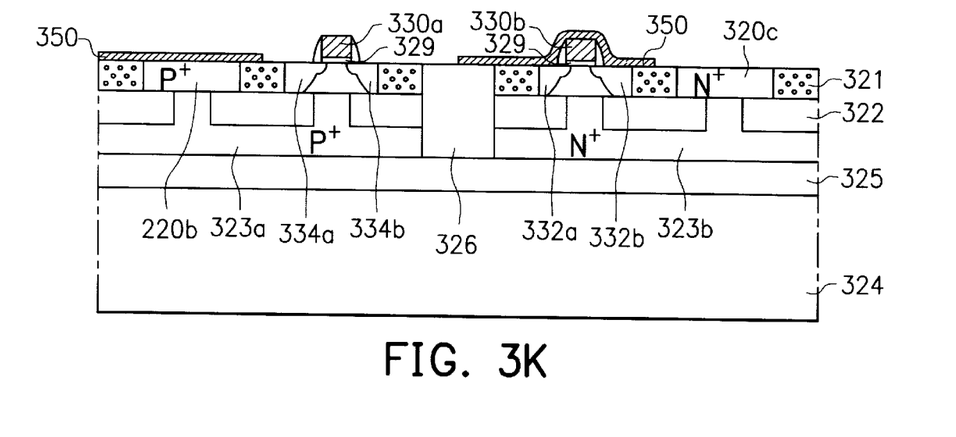

Refer to FIG. 3K, the P-type dopants inside the doped dielectric layer 350 is driven into the P-type semiconductor layer beside the first gate electrode 330b to form doped source/drain regions 332a and 332b.

Figure 3L:
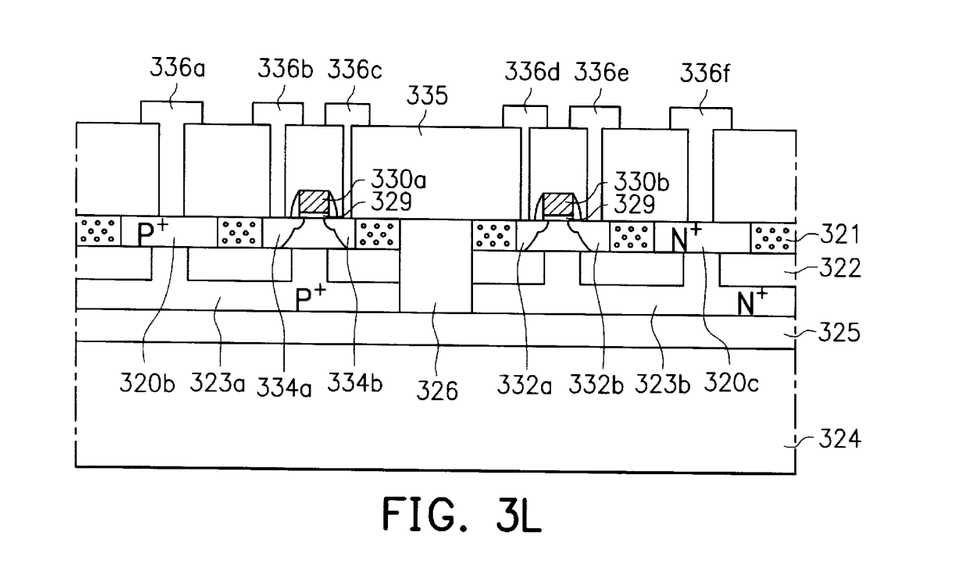

Refer to FIG. 3L, which is a cross-sectional view showing an SOI device according to an embodiment of the present invention. Depositing and removing an insulating film 335 to expose areas of the N-type semiconductor layer 320a, the P-type semiconductor layer 320c, the P-type source/drain regions 332a and 332b and the N-type source/drain regions 334a and 334bc and form contact holes. A conductive layer is formed to fill the contact holes. The conductive layer is etched to form contact pads 336a and 336f on the P-type and N-type semiconductor layers 320b and 320c and line layers 336b, 336c, 336d, 336e on the n and p source/drain regions 332a/232b and 334a/334b.

An advantage of the present invention is that only one lithography mask step is required to form the doped regions instead of the two steps required by the conventional method. Another advantage of the present invention is that the channel regions of NMOS and PMOS transistors are electrically connected to first and second conductivity type semiconductor layers, respectively, having contact pads through first and second conductivity type polysilicon layers, thereby reducing floating body effects and thus improving the operation characteristics.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating an SOI device comprising:

providing a first substrate, wherein the substrate has a plurality of trenches, wherein the trenches are filled with oxide to form a first oxide film;

forming a patterned first buried dielectric film on the first semiconductor substrate;

depositing an undoped polysilicon layer on the first buried dielectric film and the first substrate;

depositing a second buried dielectric film on a second substrate;

bonding the second buried dielectric film on the second substrate and the undoped polysilicon layer on the first substrate;

removing the first substrate until the first oxide film is exposed to form a semiconductor layer;

forming a trench isolation layer by etching a portion of the semiconductor layer between the first oxide film, the first buried dielectric film, and the undoped polysilicon layer and filling oxide therein;

forming and patterning a first photoresist film on the first oxide film, the semiconductor layer and the isolation oxide film to expose a part of the trench isolation layer;

using the first photoresist film as a mask, ion implanting the undoped polysilicon layer to create a P-type heavily doped polysilicon layer;

forming and patterning a second photoresist film on the first oxide film, the semiconductor layer and the isolation oxide film to expose a part of the isolation oxide film that was covered by the first photoresist film;

using the second photoresist film as a mask, ion implanting the undoped polysilicon layer to create an N-type heavily doped polysilicon layer;

forming an oxide film and an silicon layer to form a first gate oxide film and a first gate electrode for an NMOS transistor and a second gate oxide film and a second gate electrode for a PMOS transistor on the semiconductor layer;

forming an N-doped dielectric layer;

forming and patterning a third photoresist film over the n-doped dielectric layer;

removing an area of the n-doped dielectric layer to expose the semiconductor layer on both sides of the second gate electrode and where the first gate electrode is not exposed;

using the third patterned photoresist film as a mask, performing a first ion implanting upon the semiconductor layer to form P-type doped source/drain regions and a P-type semiconductor layer;

removing the third photoresist film;

driving N-type dopants inside the n-doped dielectric layer into the semiconductor layer to form N-type doped source/drain regions and an N-type semiconductor layer; and removing the n-doped dielectric layer.

2. The method of claim 1, wherein the first buried dielectric layer is a silicon dioxide layer.

3. The method of claim 1, wherein the first burried dielectric layer is a silicon nitride layer.

4. The method of claim 1, wherein the step of removing the first substrate is by chemical mechanical polishing (CMP).

5. The method of claim 1, wherein the n-doped dielectric layer is made of phosphosilicate glass (PSG).

6. The method of claim 1, wherein the n-doped dielectric layer is made of n-doped Spin-On Glass (SOG).

7. The method of claim 1, wherein the n-doped dielectric layer is formed by chemical vapor deposition (CVD).

8. The method of claim 1, wherein the step of performing first ion implanting is with boron-containing ions.

9. A method for fabricating an SOI device comprising:

providing a first substrate, wherein the substrate has a plurality of trenches, wherein the trenches are filled with oxide to form a first oxide film;

forming a patterned first buried dielectric film on the first semiconductor substrate;

depositing an undoped polysilicon layer on the first buried dielectric film and the first substrate;

depositing a second buried dielectric film on a second substrate;

bonding the second buried dielectric film on the second substrate and the undoped polysilicon layer on the first substrate;

removing the first substrate until the first oxide film is exposed to form a semiconductor layer;

forming a trench isolation layer by etching a portion of the semiconductor layer between the first oxide film, the first buried dielectric film, and the undoped polysilicon layer and filling oxide therein;

forming and patterning a first photoresist film on the first oxide film, the semiconductor layer and the isolation oxide film to expose a part of the trench isolation layer;

using the first photoresist film as a mask, ion implanting the undoped polysilicon layer to create a P-type heavily doped polysilicon layer;

forming and patterning a second photoresist film on the first oxide film, the semiconductor layer and the isolation oxide film to expose a part of the isolation oxide film that was covered by the first photoresist film;

using the second photoresist film as a mask, ion implanting the undoped polysilicon layer to create an N-type heavily doped polysilicon layer;

forming an oxide film and an silicon layer to form a first gate oxide film and a first gate electrode for an NMOS transistor and a second gate oxide film and a second gate electrode for a PMOS transistor on the semiconductor layer;

forming an p-doped dielectric layer;

forming and patterning a third photoresist film over the p-doped dielectric layer;

removing an area of the p-doped dielectric layer to expose the semiconductor layer on both sides of the first gate electrode and where the second gate electrode is not exposed;

using the third patterned photoresist film as a mask, performing a first ion implanting upon the semiconductor layer to form N-type doped source/drain regions and a N-type semiconductor layer;

removing the third photoresist film;

driving P-type dopants inside the p-doped dielectric layer into the semiconductor layer to form P-type doped source/drain regions and an P-type semiconductor layer; and removing the p-doped dielectric layer.

10. The method of claim 9, wherein the first buried dielectric layer is a silicon dioxide layer.

11. The method of claim 9, wherein the first buried dielectric layer is a silicon nitride layer.

12. The method of claim 9, wherein the step of removing the first substrate is by chemical mechanical polishing (CMP).

13. The method of claim 9, wherein the p-doped dielectric layer is made of boronsilicate glass (BSG).

14. The method of claim 9, wherein the p-doped dielectric layer is made of p-doped Spin-On Glass (SOG).

15. The method of claim 9, wherein the n-doped dielectric layer is formed by chemical vapor deposition (CVD).

16. The method of claim 1, wherein the step of performing first ion implanting is with As-containing ions.

17. A method for fabricating an SOI device comprising:

providing a first semiconductor substrate;

etching the first semiconductor substrate to form a plurality of trenches;

depositing and polishing an first oxide film on the first semiconductor substrate and to fill the trenches;

forming a first buried dielectric film on the first semiconductor substrate;

forming and patterning a photoresist film on the first buried dielectric film;

using the patterned photoresist as a mask, removing the first buried dielectric film to expose the first substrate;

depositing an undoped polysilicon layer on the first buried dielectric film and the first substrate;

etching the undoped polysilicon layer;

depositing a second buried dielectric film on a second semiconductor substrate;

bonding the second buried dielectric film on the second substrate and the undoped polysilicon layer on the first substrate;

removing the first substrate until the first oxide film is exposed to form a semiconductor layer;

etching the semiconductor layer between the first oxide film, the first buried dielectric film, and the undoped polysilicon layer to form a trench isolation region;

depositing an oxide film on the first oxide film, the semiconductor layer, and the trench isolation region;

planarizing the oxide film to form an isolation oxide film;

forming and patterning a first photoresist film on the first oxide film, the semiconductor layer and the isolation oxide film to expose a part of the isolation oxide film;

using the first photoresist film as a mask, ion implanting the undoped polysilicon layer to create a P-type heavily doped polysilicon layer;

forming and patterning a second photoresist film on the first oxide film, the semiconductor layer and the isolation oxide film to expose a part of the isolation oxide film that was covered by the first photoresist film;

using the second photoresist film as a mask, ion implanting the undoped polysilicon layer to create an N-type heavily doped polysilicon layer;

depositing an oxide film;

depositing a silicon layer;

etching the oxide film and silicon layer to form a first gate oxide film and a first gate electrode for an NMOS transistor and a second gate oxide film and a second gate electrode for a PMOS transistor on the semiconductor layer;

forming an n-doped dielectric layer;

forming and patterning a photoresist film over the n-doped dielectric layer;

removing an area of the n-doped dielectric layer to expose the semiconductor layer on both sides of the second gate electrode and where the first gate electrode is not formed;

using the patterned photoresist film as a mask, ion implanting the semiconductor layer to form P-type doped source/drain regions and a P-type semiconductor layer;

removing the photoresist film;

driving n-dopant inside the n-doped dielectric layer into the semiconductor layer to form N-type doped source/drain regions and an N-type semiconductor layer;

removing the n-doped dielectric layer;

depositing and removing an insulating film to expose areas of the P-type semiconductor layer, the N-type semiconductor layer, the P-type source/drain regions and the N-type source/drain regions and to form contact holes;

forming a conductive layer to fill the contact holes; and etching the conductive layer to form contact pads on the P-type semiconductor layer and the N-type semiconductor layer and to form line layers on the N-type source/drain regions and P-type source/drain regions.

18. The method of claim 17, wherein the first buried dielectric layer is a silicon dioxide layer.

19. The method of claim 17, wherein the first burried dielectric layer is a silicon nitride layer.

20. The method of claim 17, wherein the step of removing the first substrate is by chemical mechanical polishing (CMP).

21. The method of claim 17, wherein the n-doped dielectric layer is made of phosphosilicate glass (PSG).

22. The method of claim 17, wherein the n-doped dielectric layer is made of n-doped Spin-On Glass (SOG).

23. The method of claim 17, wherein the n-doped dielectric layer is formed by chemical vapor deposition (CVD).

24. The method of claim 17, wherein the step of performing first ion implanting is with boron-containing ions.

25. A method for fabricating an SOI device comprising:

providing a first semiconductor substrate;

etching the first semiconductor substrate to form a plurality of trenches;

depositing and polishing an oxide film on the first semiconductor substrate and to fill the trenches;

forming a first buried dielectric film on the first semiconductor substrate;

forming and patterning a photoresist film on the first buried dielectric film;

using the patterned photoresist as a mask, removing the first buried dielectric film to expose the first substrate;

depositing an undoped polysilicon layer on the first buried dielectric film and the first substrate;

etching the undoped polysilicon layer;

depositing a second buried dielectric film on a second semiconductor substrate;

bonding the second buried dielectric film on the second substrate and the undoped polysilicon layer on the first substrate;

removing the first substrate until the first oxide film is exposed to form a semiconductor layer;

etching the semiconductor layer between the first oxide film, the first buried dielectric film, and the undoped polysilicon layer to form a trench isolation region;

depositing an oxide film on the first oxide film, the semiconductor layer, and the trench isolation region;

planarizing the oxide film to form an isolation oxide film;

forming and patterning a first photoresist film on the first oxide film, the semiconductor layer and the isolation oxide film to expose a part of the isolation oxide film;

using the first photoresist film as a mask, ion implanting the undoped polysilicon layer to create a P-type heavily doped polysilicon layer;

forming and patterning a second photoresist film on the first oxide film, the semiconductor layer and the isolation oxide film to expose a part of the isolation oxide film that was covered by the first photoresist film;

using the second photoresist film as a mask, ion implanting the undoped polysilicon layer to create an N-type heavily doped polysilicon layer;

depositing an oxide film;

depositing a silicon layer;

etching the oxide film and silicon layer to form a gate oxide film and a first gate electrode for an NMOS transistor and a gate oxide film and a second gate electrode for a PMOS transistor on the semiconductor layer;

forming an p-doped dielectric layer;

forming and patterning a photoresist film over the p-doped dielectric layer;

removing an area of the p-doped dielectric layer to expose the semiconductor layer on both sides of the second gate electrode and where the first gate electrode is not formed;

using the patterned photoresist film as a mask, ion implanting the semiconductor layer to form N-type doped source/drain regions and a N-type semiconductor layer;

removing the photoresist film;

driving p-dopant inside the p-doped dielectric layer into the semiconductor layer to form P-type doped source/drain regions and an P-type semiconductor layer;

removing the p-doped dielectric layer;

depositing and removing an insulating film to expose areas of the P-type semiconductor layer, the N-type semiconductor layer, the P-type source/drain regions and the N-type source/drain regions and to form contact holes;

forming a conductive layer to fill the contact holes; and etching the conductive layer to form contact pads on the P-type semiconductor layer and the N-type semiconductor layer and to form line layers on the N-type source/drain regions and P-type source/drain regions.

26. The method of claim 25, wherein the first buried dielectric layer is a silicon dioxide layer.

27. The method of claim 25, wherein the first buried dielectric layer is a silicon nitride layer.

28. The method of claim 25, wherein the step of removing the first substrate is by chemical mechanical polishing (CMP).

29. The method of claim 25, wherein the p-doped dielectric layer is made of boronsilicate glass (BSG).

30. The method of claim 25, wherein the p-doped dielectric layer is made of p-doped Spin-On Glass (SOG).

31. The method of claim 25, wherein the n-doped dielectric layer is formed by chemical vapor deposition (CVD).

32. The method of claim 25, wherein the step of performing first ion implanting is with As-containing ions.

* * * * *